United States Patent [19]

Assel et al.

[11] Patent Number: 4,699,594
[45] Date of Patent: Oct. 13, 1987

[54] PLUG-IN AND DISCONNECT AID

[75] Inventors: Eugen Assel, Knetzgau; Burkhard Dasbach, Erlangen; Bernd Weber, Aalen, all of Fed. Rep. of Germany

[73] Assignee: Siemens Aktiengesellschaft, Berlin and Munich, Fed. Rep. of Germany

[21] Appl. No.: 832,926

[22] Filed: Feb. 24, 1986

[30] Foreign Application Priority Data

Mar. 11, 1985 [DE] Fed. Rep. of Germany ....... 3508580

[51] Int. Cl.⁴ ............................................. H07R 13/62
[52] U.S. Cl. ..................................... 439/152; 439/347; 439/64
[58] Field of Search .............. 339/45, 75, 17 R, 17 C, 339/91 R

[56] References Cited

U.S. PATENT DOCUMENTS

| 3,311,863 | 3/1967 | Beale | 339/45 M |
|---|---|---|---|
| 4,064,551 | 12/1977 | Lightfoot | 339/45 M |
| 4,183,602 | 1/1980 | Meunier et al. | 339/45 M |
| 4,197,572 | 4/1980 | Aimar | . |
| 4,233,646 | 11/1980 | Leung et al. | 339/45 M |
| 4,602,835 | 7/1986 | Bauer et al. | 339/45 M |

FOREIGN PATENT DOCUMENTS

| 2850440 | 5/1979 | Fed. Rep. of Germany | ... 339/45 M |
|---|---|---|---|
| 3146904 | 6/1983 | Fed. Rep. of Germany | . |
| 3329415 | 10/1984 | Fed. Rep. of Germany | . |
| 3407877 | 9/1985 | Fed. Rep. of Germany | . |

OTHER PUBLICATIONS

European Patent Office Patentanmeldung, issued Jan. 2, 1985 to W. Bauer, O. Kessler, K. Klein, R. Schmitt and G. Wojtas for "Frontsystem fuer in Baugruppentraeger einschiebbare steckbaugruppen and rahmenartige Baugruppentraeger zu deren Aufnhame", Translation not available.

Primary Examiner—Gil Weidenfeld
Assistant Examiner—David Pirlot
Attorney, Agent, or Firm—Volker R. Ulbrich

[57] ABSTRACT

The invention concerns a plug-in and disconnect aid device for plug-in subassemblies of a mechanical arrangement which can be inserted in rack subassemblies, wherein a lever by means of an end piece is connected to a subassembly in such a fashion that the axis of rotation of lever is positioned vertically to the insertion plane in the end piece and wherein the lever is designed to release a lock element. In accordance with the invention, the lever is designed as a connecting member which by means of a guide is positioned in a guide of a first fixed-mounted arm of end piece; that parallel to the first arm; there is a second arm having a locking projection spring-mounted in such a fashion that its guide edge mates with guide piece; that the guide is designed such that a swivel action of lever is converted into a motion of the second arm parallel to the insertion plane; and that lever is designed with a keyway whose outer edges are designed as projections. Thereby the design produces a plug-in and disconnect aid device whose spatial requirement is only negligibly larger than that of the keyway of the cooperating transverse rail of the rack subassembly.

9 Claims, 7 Drawing Figures

PLUG-IN AND DISCONNECT AID

BACKGROUND OF THE INVENTION

This invention relates to a plug-in and disconnect aid for plug-in subassemblies such as printed circuit subassemblies which can be plugged into a mechanical arrangement such as rack subassemblies. Such disconnect aids have a lever which is connected with the plug-in subassembly and the lever directs force against a catch element of the rack subassembly providing insertion aid during plug-in, and disconnect aid during removal of the plug-in subassembly.

In known systems the normally rectangular parallelepiped plug-in subassemblies are plugged into frame-type rack subassemblies equipped with guides until the plug-in elements arranged on a back panel mate with the corresponding elements of the back-side wiring. When using plug-in subassemblies in a double to triple European format with, for example, up to three 96-pole housing plug connectors, the required plug-in and disconnect forces increase to such a degree that a lever system must be designed to reduce the force required to be exerted when plugging and disconnecting the subassemblies.

A plug-in and disconnect aid, as described above, is already known from the German Offenlegensschrift DE No. 34 07 877. In this design the end piece has a guide element which meshes with one key of the transverse rail of the rack subassembly. In this design the guide element is led to mate against a corresponding guide of the transverse rail. By means of the frontal panel the lower and upper transverse rails are thus coupled. The side of the guide element facing the transverse rail is designed in a step-shaped pattern.

Said shape forms a stop for a spring serving as a catch, which is mounted in a contour fitting manner in the keyway of the transverse rail.

It is the object of this invention to design a plug-in and disconnect aid device which substantially reduces the spatial requirement for the lever while simultaneously reducing the force required to be exerted when plugging in and disconnecting the plug-in subassemblies.

SUMMARY OF THE INVENTION

Briefly stated in accordance with one aspect of the invention, these objects can be achieved by providing a plug-in and disconnect aid for plug-in subassemblies of a mechanical arrangement, which can be slid into a rack subassembly with a lever connecting to a plug-in subassembly by means of an end piece having an axis of rotation of the lever positioned vertically to the insertion plane in the end piece, wherein the lever is designed to release a locking element. The plug-in and disconnect aid is characterized by having the lever be designed as a connecting member which by means of a guide piece is positioned in a guide of a first fixed-mounted arm of the end piece. A second arm parallel to the first arm, is designed with a locking projection, spring-mounted such that its guide edge mates with the guide piece. The guide is designed such that a swivel action of the lever produces motion of the second arm parallel to the insertion plane. Moreover, a first plurality of projections on said lever cooperates with a transverse rail having a keyway cut therein, meshing in a locked position of the lever with a projection corresponding to the keyway of the transverse rail, whereby a swivel action of the lever towards the transverse track causes one of the first plurality of projections of the lever to support itself on an outer surface of the cooperating transverse rail projection. Further, a swivel motion of the aid in a direction of a frontal panel causes one of the first plurality of projections to support itself against an inner projection of the keyway, and causes the lever to support itself on the inner surface of a projection of the transverse rail.

In the plug-in and disconnect aid according to this invention the lever is designed in such a fashion as a connecting member and mounted by means of a guide piece in a guide of a first, fixed-mounted arm of the end piece so that a swivel motion of the lever is converted into a motion of the second arm parallel to the insertion plane. Thus, the design provides assistance for a plug-in and disconnect aid whose spatial requirement is only slightly greater than that of the keyway of the corresponding transverse rail of the rack subassembly. In addition, by designing the lever in conjunction with its end piece, the expenditure of force to plug in and disconnect the plug-in subassembly is substantially reduced.

In a preferred embodiment of the design of the invention, the surface of the locking projection of the second arm of the end piece facing the inner surface of the corresponding projection of the transverse rail is concave, with the inner surface of the corresponding projection of the transverse rail being provided with a positive slope. By this design of the locking projection of the second arm of the end piece and the inner surface of the corresponding keyway of the transverse rail of the rack subassembly, work tolerances of the subassemblies and of the rack subassembly can be compensated in reference to their total length. Thereby, one obtains a plug-in and disconnect aid with depth tolerance compensation.

In a further preferred embodiment of the design, the surface of the first arm facing away from the second arm of the end piece is fitted with a spiral spring which surrounds the guide piece in such a fashion that the latter is held in a stable position by the guide, with the narrow side of the first arm facing away from the transverse rail being equipped with a recess. Moreover, the inner surface of the lever facing the recess of the first arm is fitted with a web member in such a fashion that when the lever is locked in position, the web member is positioned parallel to the frontal panel of the plug-in subassembly, with the free end of the spiral spring being pressed down. This design ensures that the plug-in and disconnect aid is always in a locked position whenever no force counteracts the spiral spring force via the external keyway of the lever. Thereby the operator who wishes to insert the plug-in subassemblies in the rack subassembly, no longer has to align the plug-in and disconnect aid in its locking position. Thus the use of said plug-in and disconnect aids is substantially simplified.

In a further embodiment of the plug-in and disconnect aid, the edge of the second arm facing the alignment edge is surrounded by a contact spring, wherein one end of the contact spring is mounted in one indentation of the second arm and the other end designed as the cover for the fastening flange of the end piece, with the contact spring being designed with contact tips in the area of the front panel. Moreover, the inner surface of the keyway of the transverse rail of the rack subassembly is electrically conducting. Thus, any electromagnetic interference currents from the frontal panel and from the printed circuit board can be grounded via the transverse rail. Thus, the electromagnetic compatibility as well as the contacting parameters in accordance with the standards are substantially improved.

BRIEF DESCRIPTION OF THE DRAWINGS

While the specification concludes with claims particularly pointing out and distinctly claiming the subject matter of the invention, the invention can be better understood by referring to the drawings in which:

DESCRIPTION OF A PREFERRED EMBODIMENT

Figure 1:
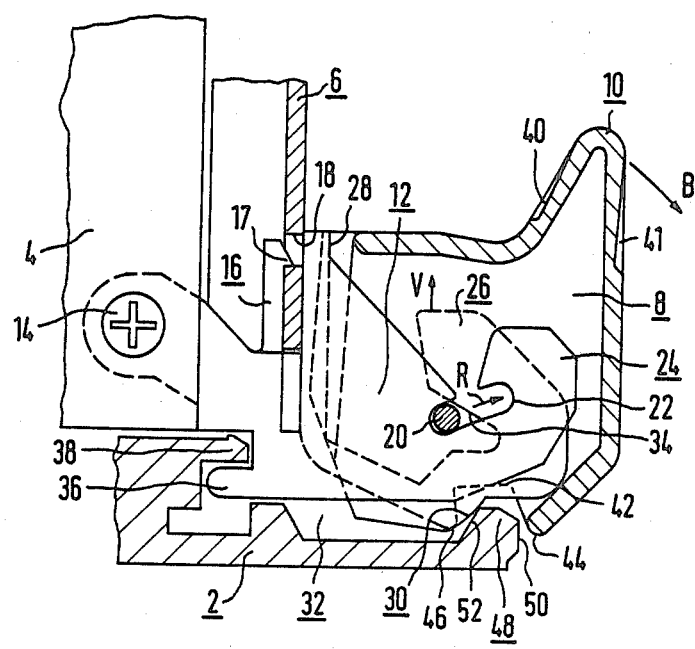
FIG. 1 shows a plug-in and disconnect aid in accordance with the invention.

In the depiction shown in FIG. 1, a section of the rack subassembly is shown, of which for clarity's sake only the lower transverse rail 2 is depicted. The rack subassembly serves to accommodate plug-in subassemblies each of which, in turn, consists of a printed circuit board 4 fitted with components and contact elements. This printed circuit board 4 is fitted with a frontal panel 6 towards the front of the rack subassembly. In a plug-in subassembly, for example, of a double European format, there is a plug-in and disconnect aid each at the upper and lower end of each frontal panel 6, of which, however, only plug-in and disconnect aid 8 is shown, on the other hand a subassembly of a simple European format is provided with only one plug-in and disconnect aid. The plug-in and disconnect aid not shown for simplicity's sake at the upper end corresponds to the plug-in and disconnect aid shown, but is its mirror image.

Figure 3:
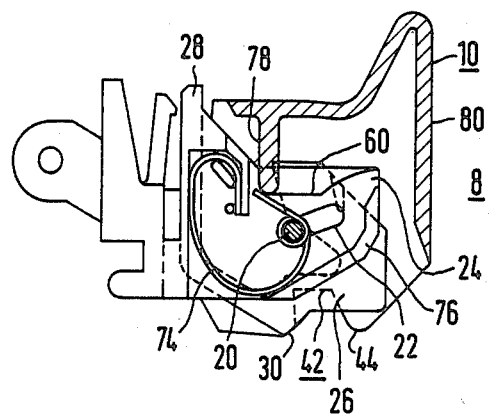
FIGS. 3 through 5 show the plug-in and disconnect aid in its locking, locked and released positions respectively.
Figure 4:
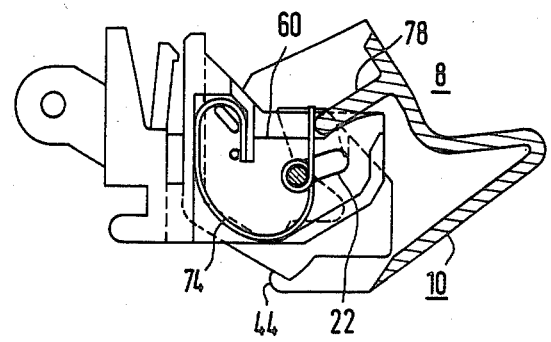
Figure 5:
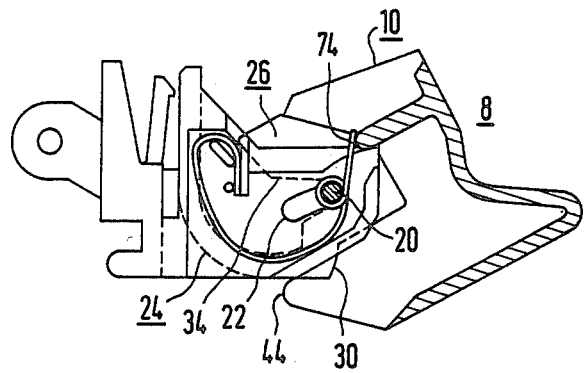

The plug-in and disconnect aid 8 consists of a lever 10 and an end piece 12 which is mounted to printed circuit board 4 by bolt 14. Moreover, end piece 12 is connected by an extruded connection and by means of a leaf spring 16 to frontal panel 6. Thereby, a locking projection 17 of leaf spring 16 of end piece 12 meshes with an opening 18 of frontal panel 6. Lever 10 is designed as a connecting member and mounted by means of a guide piece 20 or a cylindrical pin in a guide 22 of a first fixed-mounted arm 24 of end piece 12. Parallel to the first arm 24, there is a second spring-mounted arm 26, with both arms 24 and 26 interconnected by a support wall 28. This springmounted second arm 26 is fitted with a projection 30 which is arranged so that in the locked position as per the figure the projection fits within a keyway 32 of transverse rail 2 of the rack subassembly. The second arm 26 has nearly the shape of a hook which encompasses guide piece 20. In addition, the alignment edge 34 of the second arm 26 facing guide piece 20 rests against the latter. Guide 22 of the first fix-mounted arm 24 is designed so that a swivelling action of lever 10 according to arrow B in the direction of transverse rail 2 is converted into a motion of the second arm 26, according to arrow V, parallel to the insertion place. Thereby guide piece 20 moves into guide 22 in accordance with arrow R. Thus, projection 30 of the second arm 26 slides out of keyway 32 of transverse rail 2. By this swivel action of lever 10 according to arrow B towards transverse rail 2, lever 10 is released from its locking position as shown in FIGS. 1 and 3 into its locked position as shown in FIG. 4 and into the release position as shown in FIG. 5. In addition, end piece 12 has a guide 36 which meshes with keyway 32 of transverse rail 2 of the rack subassembly. Thus, guide 36 is conducted against a corresponding guide 38 of transverse rail 2. By means of frontal panel 6, the lower transverse rail 2 and the not shown upper transverse rail are thus locked together. A similar guide which for clarity's sake is not shown and which is designed as the mirror image of the former, is located at the upper end of frontal panel 6.

Lever 10 of the plug-in and disconnect aid is designed with inset grips 40 and 41 facing away from each other. In addition, lever 10 is fitted with a keyway 42 whose outer edges are designed as projections 44 and 46. In the locked position of lever 10 shown in FIG. 1, a corresponding projection 48 of transverse rail 2 of the rack subassembly meshes with keyway 42 of lever 10. When a swivel action of lever 10 in the direction of transverse rail 2 occurs according to arrow B, the outer projection 44 of keyway 42 of lever 10 supports itself against the outer surface 50 of the corresponding projection 48 of transverse rail 2. Given a swivel action in the opposite direction, i.e., a movement of lever 10 in the direction of frontal panel 6, inner projection 46 of keyway 42 of lever 10 supports itself against the inner surface 52 of the corresponding projection 48 of transverse rail 2.

Figure 2:
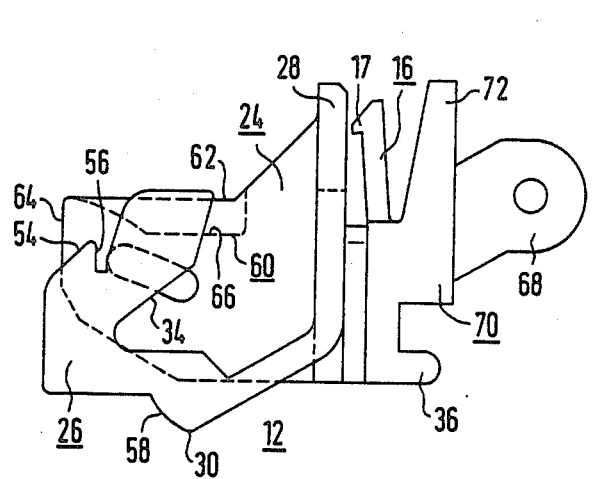
FIG. 2 depicts a preferred embodiment of the end piece of the plug-in and disconnect aid.

FIG. 2 depicts a preferred embodiment of the end piece 12 in terms of a view of the second arm 26. Edge 54 facing the alignment edge 34 of arm 26 is fitted with an indentation 56. Moreover, surface 58 of locking projection 30 of the second arm 26 is concave. First arm 24 has a recess 60 in the narrow side facing locking projection 30. In addition, recess 60 is open towards the side of arm 24 facing away from the second arm 26. Recess 60 is designed as a keyway in the area of support wall 28, while in the area of the free end of the first arm 24, recess 60 is shaped as an arch from the base 66 of recess 60 to the edge of the narrow side 62 and the frontal side 64 of the first arm 24. On the side of support wall 28 facing away from arms 24 and 26 there is a fastening flange 68 connected by means of a connecting element 70 with support wall 28. The connecting element 70 is tapered in the area of support wall 28 such that frontal panel 6 is connected to a recess at one of the connecting element's ends by means of an extrusion connection, with the width of frontal panel 6 being any size desired. The connecting area of connecting element 70 has a recess beneath fastening flange 68 which is designed for the corresponding guide 38 of transverse rail 2 of the rack subassembly, which is in turn connected to guide element 36. Above the fastening flange 68, connecting element 70 is designed as an additional support wall 72, wherein support wall 28 and the additional support wall 72 are nearly of the same height. Between the two support walls 28 and 27 leaf spring 16 is mounted with locking projection 17 facing support wall 28. The area of the connecting element 70 facing the fastening flange 68 is designed as a shoulder so that one flat side of printed circuit board 4 closes flush with the shoulder of connecting element 70. By this design of connecting element 70, particularly the additional support wall 72, it is possible to connect the end piece 12 of the plug-in and disconnect aid 8 even without a frontal panel 6 to one printed circuit board 4, without end piece 12 permitting to be pried from its position. By the concave-shaped surface 58 of locking projection 30 and the inner surface 52 of the corresponding projection 48 of transverse rail 2 which has a positive incline, at least one straight contact line results in case of contact between the two surfaces. For plug-in subassemblies which can differ by a few millimeters across their entire lengths due to fabrication factors, said straight contact line moves along inner surface 52. Thus, the result is a plug-in and disconnect aid with a depth tolerance compensation for plug-in subassemblies which fully ensures the plug-in and disconnect functions of this aid.

FIG. 3 depicts the plug-in and disconnect aid 8 in its locking position, wherein said position is characterized by frontal surface 80 of lever 10 running parallel to frontal panel 6. For simplicity's sake, only the plug-in and disconnect aid 8 is shown. In this embodiment the first arm 24 is fitted with a spiral spring 74. Said spiral spring 74 is mounted in such a fashion in the surface of arm 24 facing away from the second arm 26 that spiral spring 74 closes flush with the upper surface of an alignment rib 76 and the narrow side of support wall 28. Spiral spring 74 is tightly connected at one end to first arm 24, encloses guide piece 20, and its free end contacts in this locking position —as shown —a web 78 of lever 10. Said web in said locking position is nearly vertically positioned in recess 60 of the first arm 24 and connected with one inner surface of lever 10. Guide piece 20 is held in a stable point of guide 22 by spiral spring 74, with locking projection 30 of the second arm 30 held in keyway 32 of transverse rail 2. The free end of spiral spring 74 presses by means of web 78 the external projection 44 of keyway 42 of lever 10 into the locking position at the outer surface 50 of the corresponding projection 48 of transverse rail 2. Thereby one portion of spiral spring 74 is supported by the alignment rib 76 of the first arm 24. In said locking position of the plug-in and disconnect aid 8 the frontal surface 80 of lever 10 facing away from frontal panel 6 is positioned vertically to the insertion plane.

FIG. 4 shows the plug-in and disconnect aid 8 in a locked position. This position is assumed whenever no counterforce is applied through the outer projection 44 of keyway 42 of lever 10 to the spring force of the free end of spiral spring 74. A counterforce could, for example, be the support force of outer surface 50 of the corresponding projection 48 of transverse rail 2, which through outer projection 44 and web 78 counteracts the spring force of the free end of spiral spring 74. In said locking position web 78 is placed against the arc-shaped portion of recess 60, and guide piece 20 is positioned in the stable points of guide 22. In comparison to the locking position as shown in FIG. 3, only the position of lever 10 has changed in its locked position. This results in having each subassembly ready for insertion in the rack subassembly by means of said plug-in and disconnect aid 8. When inserting the subassemblies in the rack subassembly, no more attention needs to be paid to the position of lever 10 since by its configuration and in conjunction with its spiral spring 74, it always passes into the locked position as soon as there is no further counterforce acting on the outer projection 44 of keyway 42 of lever 10.

FIG. 5 shows the plug-in and disconnect aid 8 in its release position. In comparison to the locked position as shown in FIG. 4, lever 10 has been swivelled further in the direction of transverse rail 2. During the swivel action of lever 10 from the locked to the released position, guide piece 20 moves in guide 22 of the first arm 24 to the end of guide 22 into an unstable position, with lever 10 supported by means of the outer projection 44 of keyway 42 on the outer surface 50 of the corresponding projection 48 of transverse rail 2. As the second spring-mounted arm 26 contacts guide piece 20 with guide edge 34, arm 26 then moves in a nearly vertical direction parallel to the insertion plane so that locking projection 30 of the second arm 26 is moved out of keyway 32 of transverse rail 2. Thereby the plug-in and disconnect aid 8 and thus the plug-in subassembly is released from the rack subassembly. If then lever 10 is swivelled beyond its release position further in the position of transverse rail 2, the contact elements are pulled out of their respective plugs. As spiral spring 74 encloses guide piece 20, it is subject to tension. As soon as the subassembly has been pulled out of the rack subassembly to the extent that the supporting force of the corresponding projection 48 of transverse rail 2 no longer impacts on the external projection 44 of keyway 42 of lever 10, the released lever 10, by means of spiral spring 74, again passes into its locked position. Thereby the said design of the plug-in and disconnect aid 8 ensures a simple release of a subassembly and a removal of the subassembly from the rack subassembly without major force having to be exerted.

Figure 6:
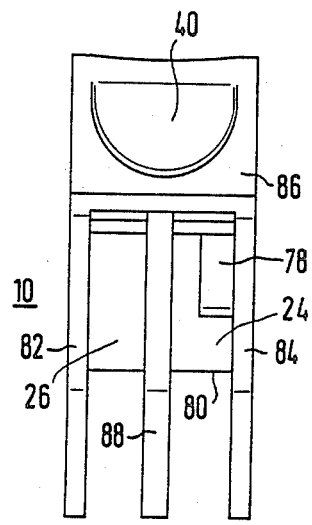
FIG. 6 shows a lever of the plug-in and disconnect aid.

FIG. 6 shows a single lever 10 in a view oriented towards the back side of lever 10. Lever 10 consists of a side surfaces 82 and 84, a front surface 80, a cover surface 86, from which one can only see the area of the reset grip 40, and a partition wall 88. Web 78 is mounted on the inner side of side surface 84. Partition 88 of lever 10 on the one hand separates the first fixed-mounted arm 24 and a spring-mounted second arm 26, and on the other hand improves the alignment of guide piece 20. Thus, the force required to insert and pull out the plug-in subassembly is substantially improved in that it is conveyed by the lever 10 designed as a connecting member via the guide piece 20 onto the end piece 12 and thus onto the transverse rail 2, without the lever 10 being toed in or out due to the sliding fulcrum mounted on one side in guide 22.

Figure 7:
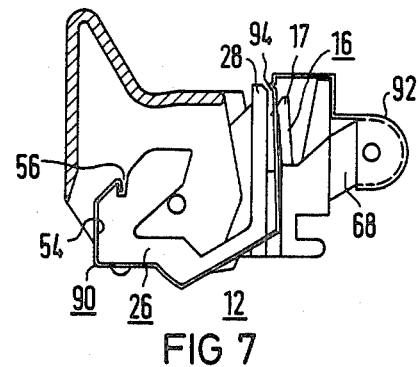
FIG. 7 shows a further preferred embodiment of the end piece of the plug-in and disconnect aid.

FIG. 7 depicts a further preferred embodiment of end piece 12. In said design, edge 54 of the second arm 26 is fitted with a contact spring 90 which with one end is mounted in indentation 56 and which is connected by its end designed as a hood 92 with fastening flange 68. In the area of support wall 28 and leaf spring 16 with hook 17, contact spring 90 is equipped with contact tips 92. In addition, the inner surface of keyway 32 of transverse rail 2 is electrically conducting. Due to this design, electromagnetic interference currents from frontal panel 6 and electromagnetic interference currents from printed circuit board 4 can be grounded over transverse rail 2. Thus, the electromagnetic compatibility and contacting in accordance with the industry standards is substantially improved.

It will now be appreciated that there has been disclosed an improved plug-in and disconnect aid device which reduces the force required to be exerted during plugging-in and disconnecting of plug-in subassemblies. As will be evident from the foregoing description, certain aspects of the invention are not limited to the particular details of the examples illustrated, and it is therefore contemplated that other modifications or applications will occur to those skilled in the art. It is accordingly intended that the claims shall cover all such modifications and applications as do not depart from the true spirit and script of the invention.

What is claimed as new and desired to be secured as Letters Patent of the United States is:

1. A plug-in and disconnect aid device for plug-in subassemblies of a mechanical arrangement, which can be slid into a rack subassembly, with a lever connecting to a plug-in subassembly by means of an end piece having an axis of rotation of the lever positioned vertically to the insertion plane in the end piece wherein the lever is designed to release a locking element, characterized by:

the lever being designed as a connecting member which by means of a guide piece is positioned in a guide of a first fixed-mounted arm of said end piece;

a second arm, parallel to the first arm and having a guide edge, is designed with a locking projection spring-mounted in such a fashion that its guide edge mates with the guide piece;

said guide being designed so that a swivel action of the lever produces a motion of the second arm parallel to the insertion plane;

and a first plurality of projections on said lever for cooperating with a transverse rail having a keyway cut therein meshing in a locked position of the lever with a transverse rail projection corresponding to the keyway; whereby a swivel action of the lever towards the transverse rail causes one of the first plurality of projections of the lever to support itself on an outer surface of the cooperating transverse rail projections, and a swivel action of the lever in the direction of a frontal panel of the subassembly, causes an inner projection of the keyway of the lever to support itself on an inner surface of the cooperating projection of the transverse rail.

2. A plug-in and disconnect aid device according to claim 1, further characterized in that the surface of the locking projection of the second arm of said end piece facing the inner surface of the corresponding projection of transverse rail is concave.

3. A plug-in and disconnect aid device according to claim 1, further characterized by having the inner surface of the corresponding projection of the transverse rail be chamfered.

4. A plug-in and disconnect aid device according to claim 1, further characterized by having a surface of the first arm facing away from the second arm of end piece include a spiral spring enclosing the guide piece in such a fashion that the guide piece is held in a stable position in the guide.

5. A plug-in and disconnect aid device according to claim 4, further characterized by having a narrow side of the first arm which faces away from transverse rail include a recess therein.

6. A plug-in and disconnect aid device according to claim 5, further characterized by having an inner surface of the lever facing the recess of the first arm designed with a web in such a fashion that in the locked position of the lever, the web is positioned parallel to the frontal panel of the subassembly and a free end of the spiral spring is pressed down.

7. A plug-in and disconnect aid device according to claim 6, further characterized by having an edge of the second arm facing the guide edge include a contact spring, wherein one end of the contact spring mates with an indentation of the second arm and the other end forms a cover for a fastening flange of said end piece, and wherein the contact spring is designed with contact tips in the area of the frontal panel.

8. A plug-in and disconnect aid device in accordance with claim 7, further characterized by having the inner surface of the keyway of the transverse rail be electrically conducting.

9. A plug-in and disconnect aid device according to claim 8, further characterized by having the lever include a partition which separates the first arm from the second arm of the end piece.

* * * * *